(12) United States Patent
Yamagata et al.

(10) Patent No.: US 8,792,027 B2
(45) Date of Patent: Jul. 29, 2014

(54) SOLID-STATE IMAGE PICKUP DEVICE, IMAGING DEVICE, AND DISPERSING ELEMENT

(75) Inventors: Michihiro Yamagata, Osaka (JP); Yasuhiro Tanaka, Hyogo (JP); Kazuhiro Yamada, Osaka (JP); Kazuyoshi Itoh, Hyogo (JP); Yasuyuki Ozeki, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 629 days.

(21) Appl. No.: 12/985,353

(22) Filed: Jan. 6, 2011

(65) Prior Publication Data

US 2011/0267487 A1    Nov. 3, 2011

(30) Foreign Application Priority Data

Jan. 6, 2010    (JP) .................................. 2010-000954

(51) Int. Cl.
| | |
|---|---|
| H04N 9/04 | (2006.01) |
| H04N 5/225 | (2006.01) |
| H01L 27/00 | (2006.01) |
| H04N 9/097 | (2006.01) |

(52) U.S. Cl.
USPC ......... 348/272; 348/340; 348/259; 250/208.1

(58) Field of Classification Search
CPC ......... H04N 9/04; H04N 5/225; H04N 9/097; H01L 27/00
USPC ...................... 348/222.1, 340, 259, 272, 294; 250/208.1, 226, 216; 359/565, 569
See application file for complete search history.

(56) References Cited

U.S. PATENT DOCUMENTS

| | | | |
|---|---|---|---|
| 4,255,019 A | 3/1981 | Knop | |
| 5,519,205 A * | 5/1996 | Rostoker | 250/208.1 |
| 5,701,005 A | 12/1997 | Meyers | |
| 6,788,863 B2 * | 9/2004 | Parker et al. | 385/122 |
| 2006/0087758 A1 | 4/2006 | Imada et al. | |
| 2006/0205107 A1 | 9/2006 | Inaba et al. | |

FOREIGN PATENT DOCUMENTS

| | | | | |
|---|---|---|---|---|
| JP | H01-202989 A | | 8/1989 | |
| JP | 11-313334 | * | 11/1999 | ............. H04N 9/097 |
| JP | H11-313334 A | | 11/1999 | |
| JP | 2003-195002 A | | 7/2003 | |

(Continued)

*Primary Examiner* — Twyler Haskins
*Assistant Examiner* — Akshay Trehan
(74) *Attorney, Agent, or Firm* — Judge Patent Associates

(57) ABSTRACT

A solid-state image pickup device capable of taking more light into light receiving regions is provided. The solid-state image pickup device of the present invention includes: a photoelectric conversion unit having a plurality of light receiving regions that are two-dimensionally arrayed, the photoelectric conversion unit for photoelectrically converting light incident on each of the light receiving regions, and outputting an electric signal according to the intensity of the incident light; a lens unit comprising a plurality of converging lenses provided on an upper layer of the photoelectric conversion unit, each of the converging lens being provided corresponding to a set of continuous first to third light receiving regions; and a dispersing element provided between the photoelectric conversion unit and the lens unit, the dispersing element being formed of a medium whose refractive index varies periodically, and diffracting beams of a first wavelength band and of a third wavelength band, having been transmitted through the converging lens, and directing the beams onto the first light receiving region and the third light receiving region, and transmitting, without diffracting, a beam of a second wavelength band, having been transmitted through the converging lens, and directing the beam onto the second light receiving region.

16 Claims, 8 Drawing Sheets

(56) References Cited

FOREIGN PATENT DOCUMENTS

| JP | 2004-238713 | A | | 8/2004 | |
| JP | 2005-079674 | | * | 3/2005 | ............ H04N 9/097 |
| JP | 2005-79674 | A | | 3/2005 | |
| JP | 2007-333558 | A | | 12/2007 | |
| JP | 2008-053627 | A | | 3/2008 | |
| JP | 2008-71920 | A | | 3/2008 | |
| JP | 2009-218357 | A | | 9/2009 | |
| JP | 2009-272568 | A | | 11/2009 | |
| WO | WO-2005/069376 | | | 7/2005 | |
| WO | WO-2009-153937 | A1 | | 12/2009 | |

\* cited by examiner

LEFT-SIDE DIFFRACTED BEAM (GREEN)  TRANSMITTED BEAM (RED)  RIGHT-SIDE DIFFRACTED BEAM (BLUE)

SOLID-STATE IMAGE PICKUP DEVICE, IMAGING DEVICE, AND DISPERSING ELEMENT

CROSS REFERENCE TO RELATED APPLICATION

The disclosure of Japanese Patent Application No. 2010-000954, filed Jan. 6, 2010, is incorporated herein by reference.

BACKGROUND OF THE INVENTION

1. Field of the Invention

The present invention relates to dispersing elements for dispersing incident light into different wavelength bands. In addition, the present invention relates to solid-state image pickup devices, and imaging devices such as digital cameras, employing the dispersing element.

2. Description of the Background Art

With the spread of digital cameras, solid-state image sensors such as CCD image sensors and CMOS image sensors have been widely used. A solid-state image sensor has a plurality of light receiving regions on a light receiving surface, and converts light incident on each region into an electric signal according to the intensity of the incident light, thereby generating image information.

In the digital camera market, reduction in device size or increase in definition of taken image are demanded. In order to reduce the size of an image sensor or increase the number of pixels in an image sensor, the area of the light receiving region corresponding to one pixel must be reduced. However, the smaller the area of a pixel is, the smaller the amount of light incident on the region of the pixel is, which causes reduction in sensitivity of the image sensor.

In the conventional solid-state image sensor, a color filter is provided in front of (on the incident side) of the light receiving region of each pixel in order to obtain a color image. The color filter absorbs or reflects light of a wavelength band other than a desired wavelength band, and thereby only light of a specific wavelength band is converged to each pixel of the solid-state image sensor. A specific configuration of the solid-state image pickup device will be described with reference to FIG. 13.

FIG. 13 is a schematic configuration diagram illustrating a part of the conventional solid-state image pickup device. Red, green, and blue color filters 210, 220, and 230 are provided corresponding to light receiving regions 300, 400, and 500 for performing photoelectric conversion, respectively. A microlens 100 is provided above each of the color filters 210, 220, and 230 so that incident light is converged to each light receiving region. For example, Japanese Laid-Open Patent Publication No. 2008-71920 discloses such a solid-state image pickup device using microlenses.

International Publication No. WO2005/069376 discloses a solid-state image pickup device in which a color filter having wavelength selectivity is formed by using an optical microlayer film, and the thickness of the color filter is reduced to achieve size reduction in the solid-state imagine pickup device. Japanese Laid-Open Patent Publication No. 2005-79674 discloses a 3-CCD imaging device in which incident light is dispersed using a photonic crystal, and the dispersed beams are converged to three solid-state image pickup devices for red, green, and blue, respectively.

SUMMARY OF THE INVENTION

However, the solid-state image pickup device disclosed in Japanese Laid-Open Patent Publication No. 2008-71920 has a problem that the loss due to the color filters causes reduction in the amount of incident light.

In the solid-state image pickup device disclosed in International Publication No. WO2005/069376, size reduction is achieved by reducing the thickness of the color filter. However, since the light, other than the light of the selected wavelength incident on each pixel, is reflected, increase in the light receiving efficiency cannot be expected.

Although the solid-state image pickup device disclosed in Japanese Laid-Open Patent Publication No. 2005-79674 performs light dispersion by using the photonic crystal, this configuration is applicable to only a 3-CCD imaging device. For example, the dispersing element disclosed in Japanese Laid-Open Patent Publication No. 2005-79674 bends light of two wavelength bands or light of three wavelength bands in the same direction. Therefore, the dispersing element is not expected to be applied to devices other than the 3-CCD imaging device having a relatively high degree of freedom in arrangement of the solid-state image pickup devices.

Therefore, an object of the present invention is to provide a solid-state image pickup device in which more light can be taken in light receiving regions without increasing the light receiving region per pixel, and an imaging device employing the solid-state image pickup device. Another object of the present invention is to provide a dispersing element for dispersing incident light.

A solid-state image pickup device according to the present invention includes: a photoelectric conversion unit having a plurality of light receiving regions that are two-dimensionally arrayed, the photoelectric conversion unit for photoelectrically converting light incident on each of the light receiving regions, and outputting an electric signal according to the intensity of the incident light; a lens unit comprising a plurality of converging lenses provided on an upper layer of the photoelectric conversion unit, each of the converging lens being provided corresponding to a set of continuous first to third light receiving regions; and a dispersing element provided between the photoelectric conversion unit and the lens unit, the dispersing element being formed of a medium whose refractive index varies periodically, and diffracting beams of a first wavelength band and of a third wavelength band, having been transmitted through the converging lens, and directing the beams onto the first light receiving region and the third light receiving region, and transmitting, without diffracting, a beam of a second wavelength band, having been transmitted through the converging lens, and directing the beam onto the second light receiving region.

An imaging device according to the present invention includes: an imaging optical system; a solid-state image pickup device for converting an optical image formed by the imaging optical system into an electric signal; and an image processing circuit for performing image processing on the electric signal obtained by the solid-state image pickup device.

A dispersing element according to the present invention deflects at least part of light that enters from an incident surface, and emits the light from an emission surface parallel to the incident surface. The dispersing element includes: a first medium having a first dielectric constant; and a second medium having a second dielectric constant different from the first dielectric constant, the second medium being configured as a plurality of parallel columnar components and are arranged in the first medium. Each of the columnar components is parallel to the incident surface of the dispersing element, and is positioned on each of intersections of a grating having, as a unit cell, a parallelogram (excluding a rectangle having four corners of equal angle), on a cross section orthogonal to each of the columnar components.

According to the solid-state image pickup device of the present invention, an incident light beam is dispersed into light beams of component wavelength bands, and the respective light beams are guided to the corresponding light receiving regions for photoelectric conversion. Therefore, the light utilization efficiency is improved as compared with the conventional method using color filters. Further, by using this solid-state image pickup device, the imaging device of the present invention can take a favorable image with stability even in low illumination environment.

Further, the dispersing element of the present invention can spatially disperse an incident light beam to predetermined places according to its wavelength bands. Therefore, when the dispersing element is used in a liquid crystal display device or the like, the dispersing element can efficiently disperse backlight to different display pixels. Therefore, even if the intensity of the backlight is low, a bright display screen can be obtained, which contributes to power saving of the device.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, preferred embodiments of the present invention will be described with reference to the drawings.

Embodiment 1

Figure 1:
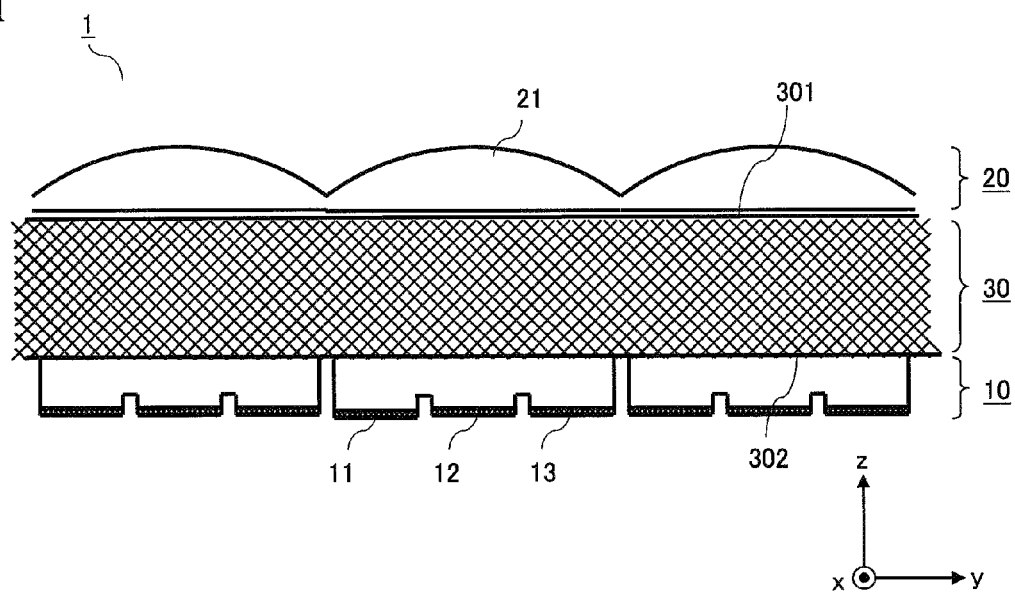
FIG. 1 is a schematic configuration diagram illustrating a solid-state image pickup device according to a first embodiment.

FIG. 1 is a schematic configuration diagram illustrating a solid-state image pickup device according to a first embodiment. The solid-state image pickup device 1 mainly includes a photoelectric conversion unit 10 formed on a semiconductor substrate, a lens unit 20, and a dispersing element 30.

The photoelectric conversion unit 10 includes a plurality of light receiving regions two-dimensionally arrayed on an xy plane in FIG. 1. The photoelectric conversion unit 10 performs photoelectric conversion of light incident on each light receiving region, and outputs an electric signal according to the intensity of the incident light. More specifically, the photoelectric conversion unit 10 includes light receiving regions 11 for detecting green light, light receiving regions 12 for detecting red light, and light receiving regions 13 for detecting blue light. In the present embodiment, the light receiving regions 11, 12, and 13 are repeatedly arranged in this order. The electric signals generated by photoelectric conversion in the light receiving regions 11 to 13 are outputted as color signals constituting a taken image.

The lens unit 20 comprises a plurality of converging lenses 21, and is provided above (on the light receiving surface side) of the photoelectric conversion unit 10. A converging lens 21 corresponds to a set of three or more light receiving regions that are continued in a y-axis direction. In the present embodiment, a converging lens 21 corresponds to a set of light receiving regions 11 to 13. The lens unit 20 is formed of, for example, glass or transparent resin.

The dispersing element 30 is positioned between the photoelectric conversion unit 10 and the lens unit 20. The dispersing element 30 disperses light, which enters from an incident surface 301, in accordance with its wavelength, and outputs the dispersed light from an emission surface 302. More specifically, the dispersing element 30 deflects light of green wavelength band (first wavelength band) so that the light of green wavelength band, which has transmitted through the converging lens 21, is converged mainly to the light receiving region 11 (first light receiving region) among the three light receiving regions corresponding to the converging lens 21. Further, the dispersing element 30 deflects light of blue wavelength band (third wavelength band) so that the light of blue wavelength band, which has transmitted through the converging lens 21, is converged mainly to the light receiving region 13 (third light receiving region) among the three light receiving regions corresponding to the converging lens 21. In the present embodiment, the dispersing element 30 does not deflect but transmits light of red wavelength band (second wavelength band) which has transmitted through the converging lens 21. The light of red wavelength band transmitted through the dispersing element 30 is converged mainly to the light receiving region 12 (second light receiving region) among the three light receiving regions corresponding to the converging lens 21.

Figure 2:
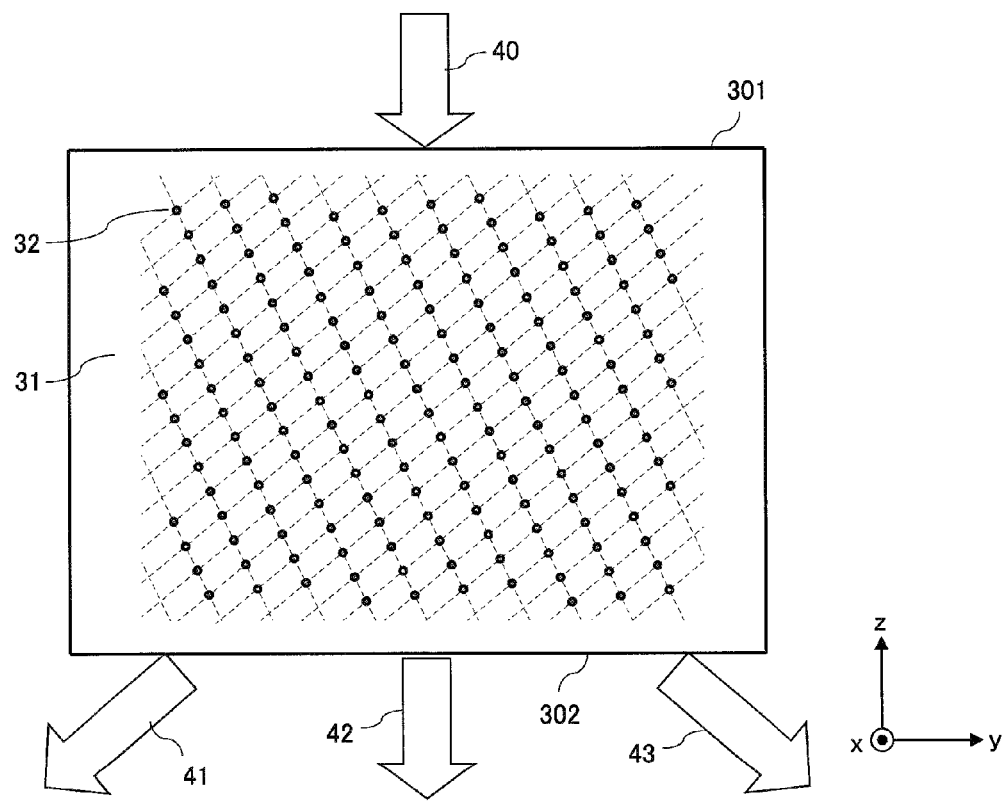
FIG. 2 is a schematic diagram illustrating the configuration of a dispersing element and the light dispersing function thereof.
Figure 3:
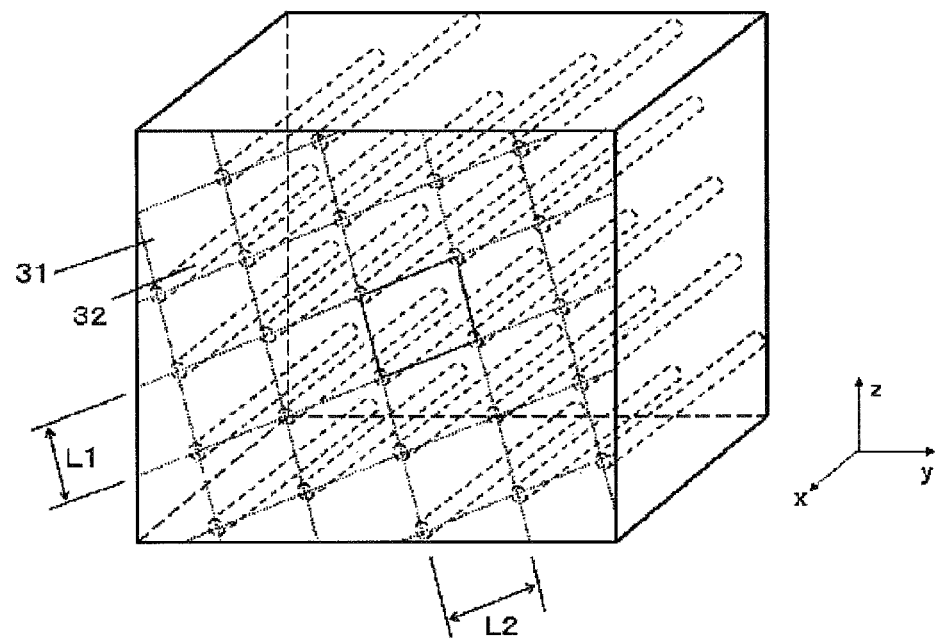
FIG. 3 is a perspective view of an enlarged part of the dispersing element.

FIG. 2 is a schematic diagram illustrating the configuration of the dispersing element and the light dispersing function thereof FIG. 3 is a perspective view of an enlarged part of the dispersing element.

The dispersing element 30 has a configuration in which a volume grating for the green wavelength band and a volume grating for the blue wavelength band are superposed. More specifically, the dispersing element 30 is realized by a photonic crystal in which columnar components formed of a second medium are periodically arranged in a first medium 31 formed of a dielectric, as shown in FIG. 3. The second medium 31 is a dielectric having a dielectric constant different from that of the first medium, or air. The columnar components formed of the second medium 32 are arranged parallel to each other and orthogonally to a yz plane in FIGS. 2 and 3. Further, on a plane parallel to the yz plane in FIGS. 2 and 3, each of the columnar components formed of the second medium 32 is positioned substantially on each of intersections of a grating having, as a unit cell, a parallelogram (excluding a rectangle having four corners of the same angle). In FIGS. 2 and 3, the grating having the columnar components on its intersections are shown by dashed lines. As an example, the first medium 31 is quartz (dielectric constant: 2.1025, refractive index: 1.45), and the second medium 32 is titanium oxide (dielectric constant: 6.35, refractive index: 2.51992). The dispersing element 30 can be manufactured by using a semiconductor process such as micro sputtering, for example.

The second medium 32 is arranged at the same periodicity over the entire light receiving regions. By arranging the second medium 32 at the uniform periodicity in this way, change of the refractive index of the dispersing element 30 becomes substantially uniform over the entire light receiving regions of the photoelectric conversion unit 10.

White light 40, which enters from the incident surface 301 of the dispersing element 30, is dispersed into light of green wavelength band 41, light of red wavelength band 42, and light of blue wavelength band 42, and the dispersed beams are emitted from the emission surface 302 parallel to the incident surface 301. When the sign of an angle formed between the light of green wavelength band 41 emitted from the dispersing element 30 and the emission surface 302 is positive, the sign of an angle formed between the light of blue wavelength band 43 emitted from the dispersing element 30 and the emission surface 302 is negative.

Now, the principle of light dispersing by the dispersing element 30 will be described. When light enters a material having a periodic structure such as a crystal structure, a phenomenon called Bragg reflection occurs, in which light of a specific wavelength is diffracted in a specific direction. Specifically, among the light components of the incident light, light components that satisfy the Bragg diffraction condition reinforce each other, and thereby a strong reflected (diffracted) output is obtained in the diffraction direction. A distributed Bragg reflector (DBR) utilizing this principle is known, in which a multilayer dielectric structure is employed to enhance reflection of a specific wavelength. By superposing a DBR structure corresponding to one wavelength band and a DBR structure corresponding to another wavelength band, a dispersing element which deflects light in different directions according to its wavelength bands can be configured.

Figure 4:
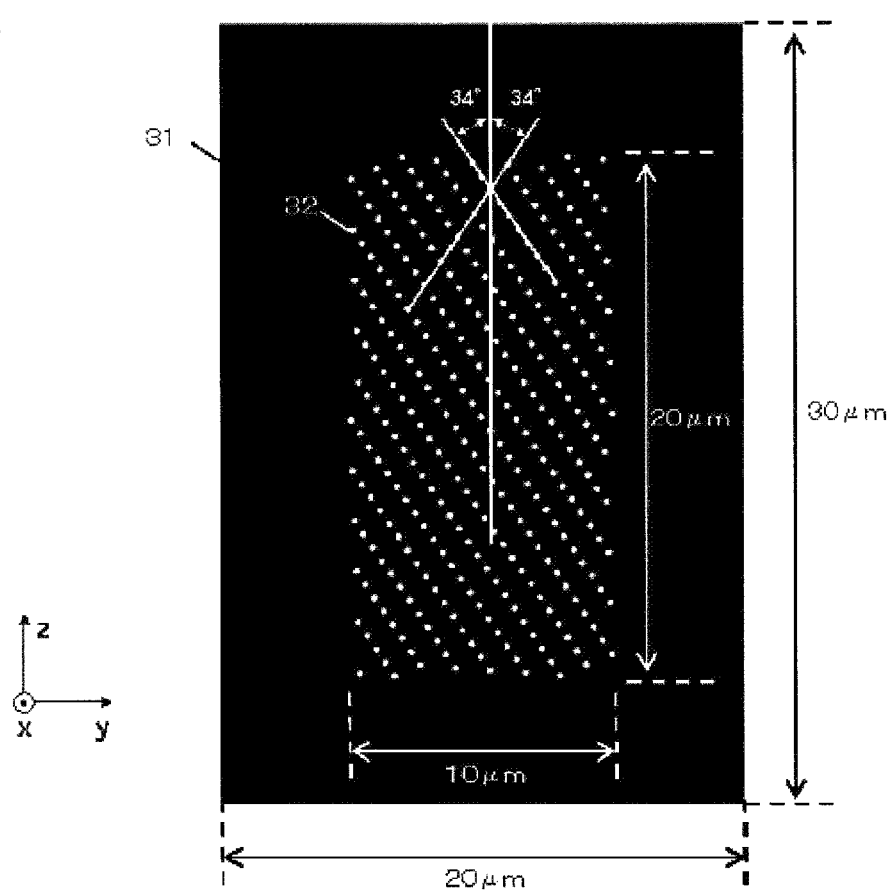
FIG. 4 is a schematic cross-sectional view of a structure obtained by simulating a part of the dispersing element.

FIG. 4 is a schematic cross-sectional view illustrating a structure obtained by simulating a part of the dispersing element. The simulation condition will be described. The simulated structure has a width of 20 μm and a thickness of 30 μm on a yz cross section. A plurality of columnar components each formed of the second medium 32 are arranged in a center part of the simulated structure, having a width of 10 μm and a thickness of 20 μm. The dielectric constant of the first medium 31 is 2.1025, and the dielectric constant of the second medium 32 is 6.35. The diameter of each columnar component formed of the second medium 32 is about 0.07 μm. As described above, on the yz cross section, the columnar components each formed of the second medium 32 are positioned substantially on the intersections of the grating having, as a unit cell, a parallelogram. The distance (L1 in FIG. 3) between a pair of opposite sides of the unit cell is 290 nm, and the distance (L2 in FIG. 3) between the other pair of opposite sides of the unit cell is 524 nm.

The grating pitch is set such that an angle formed between the DBR layer and a line orthogonal to the incident surface is 34 degrees, and the DBR exerts the first-order diffraction function on the light of green wavelength band and exerts the second-order diffraction function on the light of blue wavelength band. The reason why the second-order diffraction is used for the light of blue wavelength band is as follows. As for an interaction between light and a fine reflection object, the shorter the wavelength of the light is, the stronger the interaction is. Therefore, when the first-order diffraction is used for both the light of green wavelength band and the light of blue wavelength band, it is difficult to equalize the reflectances of the beams. So, the second-order diffraction is used for the light of blue wavelength band, i.e., the light of short wavelength band, and thereby the number of reflection objects that interact with light can be halved. Thus, the reflectance of the light of blue wavelength band can be reduced to the level of the reflectance of the light of green wavelength band. That is, the light of long wavelength band (red wavelength band) is transmitted, the light of intermediate wavelength band (green wavelength band), which is shorter than the long wavelength band, is diffracted by the first-order diffraction, and the light of short wavelength band (blue wavelength band), which is shorter than the intermediate wavelength band, is diffracted by the second-order diffraction. Thus, a dispersing element providing excellent light dispersing function can be designed.

The result obtained when white light is applied to the above-described structure from above in a vertical direction (incident angle: 0°), will be described with reference to FIGS. 5A and 5B.

Figure 5A:
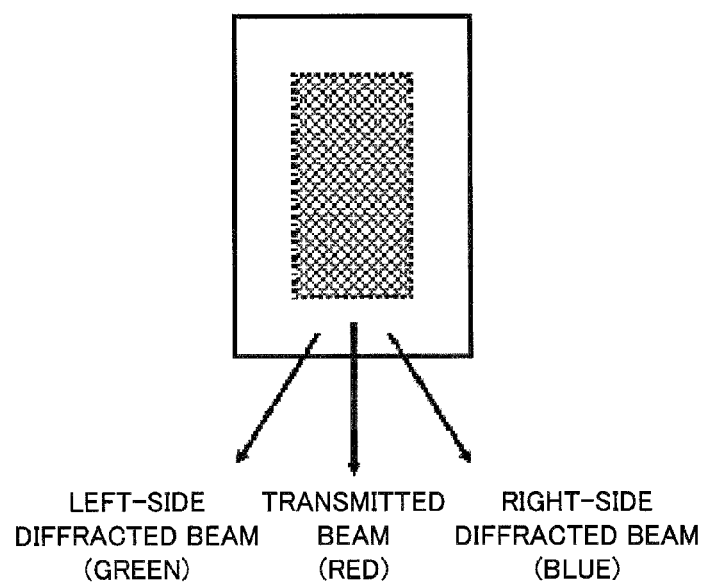
FIG. 5A is a schematic diagram illustrating a transmitted beam and diffracted beams which are emitted from the dispersing element.
Figure 5B:
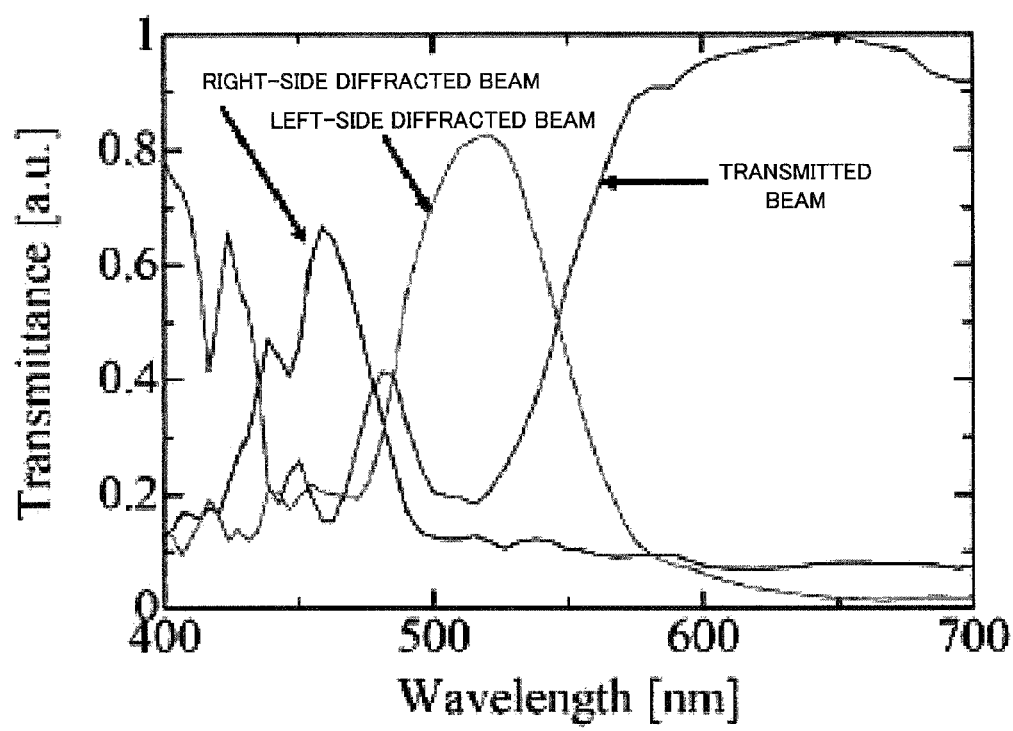
FIG. 5B is a diagram illustrating spectrum distributions of the transmitted beam and the diffracted beams.

FIG. 5A is a schematic diagram illustrating a transmitted beam and diffracted beams which are emitted from the dispersing element. FIG. 5B is a diagram illustrating spectrum distributions of the transmitted beam and the diffracted beams. As shown in FIG. 5A, the light of red wavelength band is mainly transmitted through the dispersing element, the light of green wavelength band is mainly diffracted to the left side of FIG. 5, and the light of blue wavelength band is mainly diffracted to the right side. The spectrum distributions shown in FIG. 5B prove that the transmitted light contains a lot of light of red wavelength band (600 to 700 nm), the left-side diffracted light contains a lot of light of green wavelength band (500 to 550 nm), and the right-side diffracted light contains a lot of light of blue wavelength band (430 to 480 nm). Accordingly, it is understood that the structure of the dispersing element 30 can disperse the white light into beams of the respective wavelength bands. Since the signs of the two diffraction angles are reversed, photodetectors for the beams of the respective wavelengths can be favorably arranged.

Figure 6:
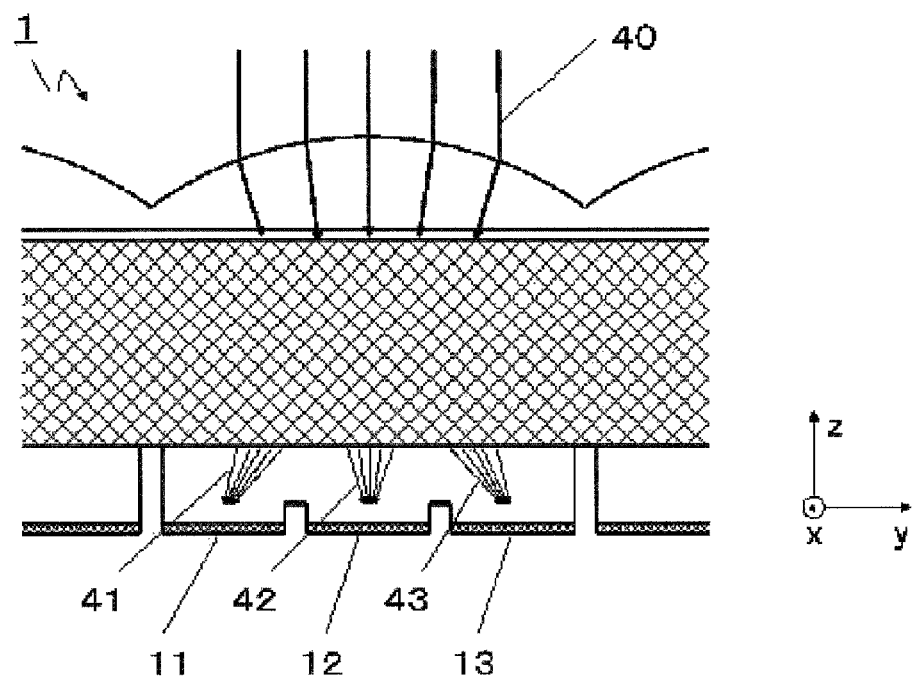
FIG. 6 is a schematic diagram illustrating the path of light incident on the solid-state image pickup device.

FIG. 6 is a schematic diagram illustrating the path of the light incident on the solid-state image pickup device shown in FIG. 1. The white light 40, which is the incident light, is converged by the converging lens 21 and guided to the dispersing element 30. In the dispersing element 30, the incident white light 40 is dispersed into beams of three wavelength bands. The light of red wavelength band 42 contained in the white light 40 is transmitted through the dispersing element 30 and converged to the red light receiving region 12. The light of green wavelength band 41 contained in the white light 40 is diffracted by the dispersing element 30 and converged to the green light receiving region 11. The light of blue wavelength band 43 contained in the white light 40 is diffracted by the dispersing element 30 and converged to the blue light receiving region 13.

In this way, according to the solid-state image pickup device 1 of the present embodiment, since the white light is dispersed by the dispersing element 30 and guided to the light receiving regions of the respective colors, the loss of light can be significantly reduced as compared to the case where the color filters are used. In addition, more light can be taken in the light receiving regions without expanding the light receiving region per pixel.

Further, according to the solid-state image pickup device of the present embodiment, since the plurality of converging lenses 21 and the dispersing element 30 are used, the light dispersing function can be achieved for each converging lens 21.

Embodiment 2

Figure 7:
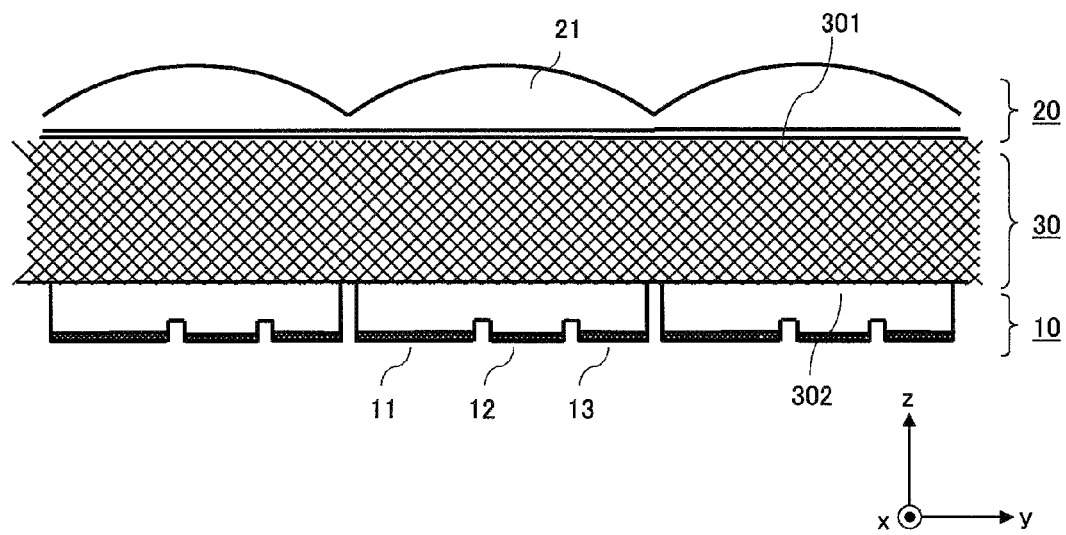
FIG. 7 is a schematic configuration diagram illustrating a solid-state image pickup device according to a second embodiment.

FIG. 7 is a schematic configuration diagram illustrating a solid-state image pickup device according to a second embodiment. The following will mainly describe the difference between the present embodiment and the first embodiment.

In the first embodiment, the red light receiving region 12, the green light receiving region 11, and the blue light receiving region 13 have approximately the same area. In this case, the light receiving area for green light is reduced as compared to a solid-state image pickup device having ordinary RGB Bayer color filters.

So, in the present embodiment, the light receiving region 11 is increased relative to the light receiving regions 12 and 13 to increase the ratio of the light receiving area for green light. Thus, by varying the area of the light receiving region according to the colors, the balance among the amounts of the received beams of the respective colors can be appropriately set.

In the present embodiment, in order to increase the area of a light receiving region that receives light of a specific wavelength band (for example, the green light receiving region 11), the area of some light receiving area is increased. Instead of this method, four or more light receiving regions may be associated with one converging lens 21, and a plurality of adjacent light receiving regions may be caused to receive light of a specific wavelength band while maintaining the area of each light receiving region constant.

Embodiment 3

Figure 8:
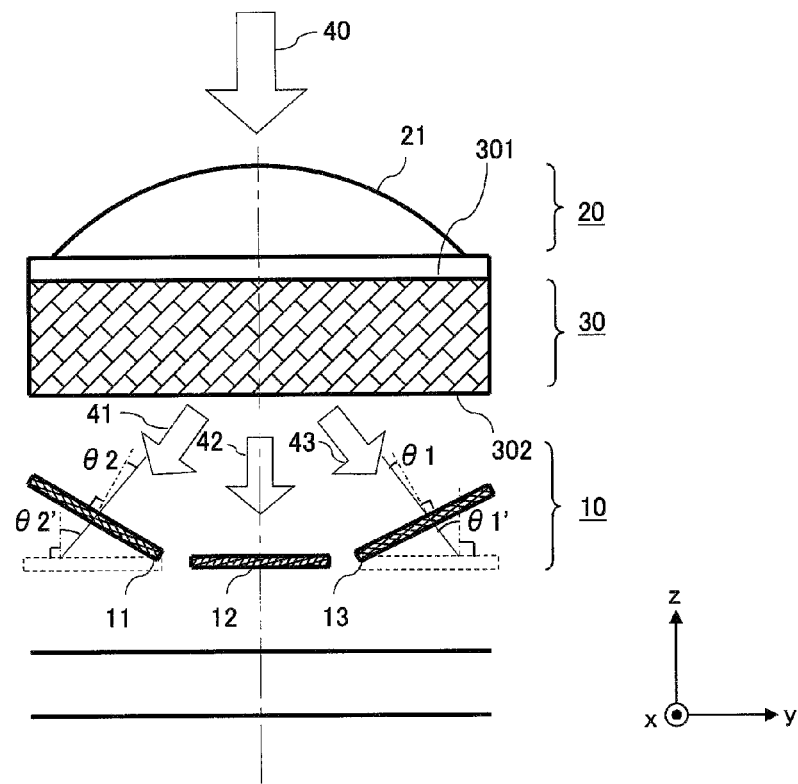
FIG. 8 is a configuration diagram illustrating a solid-state image pickup device according to a third embodiment.

FIG. 8 is a schematic configuration diagram illustrating a solid-state image pickup device according to a third embodiment. The following will mainly describe the difference between the present embodiment and the first embodiment.

In the present embodiment, the light receiving surfaces of the green light receiving region 11 and the blue light receiving region 13 are inclined with respect to the incident surface of the dispersing element 30. Specifically, the light receiving surface of the light receiving region 13 is inclined so that an angle $\theta 1$ formed between the normal line of the light receiving surface of the light receiving region 13 and the light transmitted through the dispersing element 30 is smaller than an angle $\theta 1'$ in the case where the light receiving surface is not inclined. Likewise, the light receiving surface of the light receiving region 11 is inclined so that an angle $\theta 2$ formed between the normal line of the light receiving surface of the light receiving region 11 and the light transmitted through the dispersing element 30 is smaller than an angle $\theta 2'$ in the case where the light receiving surface is not inclined. Thus, the light receiving surface that receives the diffracted light is inclined with respect to the incident surface 301 to approximate the incident direction to the normal line of the light receiving surface, and thereby the loss of light caused by reflection at the incident surface is reduced. Accordingly, it is preferable that the incident direction of the diffracted light be approximated, as much as possible, to the normal direction of the incident surface, and it is most preferable that the incident direction of the diffracted light be parallel to the normal direction (the incident angle of the diffracted light to the light receiving surface be 0°).

Further, inclining the light receiving surfaces of the light receiving regions 11 and 13 has an additional advantage that the area of the incident surface can be increased. That is, in the case where three light receiving regions are provided within the projection range of one converging lens 21, if all the light receiving regions are parallel to the incident surface of the dispersing element 30, the light receiving area is inevitably limited. However, if the light receiving surfaces of the light receiving regions are inclined with respect to the incident surface of the dispersing element 30, the substantial light receiving area can be increased. As a result, the incident light utilization efficiency can be further improved.

In the present embodiment, both of the light receiving regions 11 and 13 are inclined. However, one of the light receiving regions 11 and 13 may be inclined. In this case, the incident efficiency to the inclined light receiving region can be improved.

Embodiment 4

Figure 9:
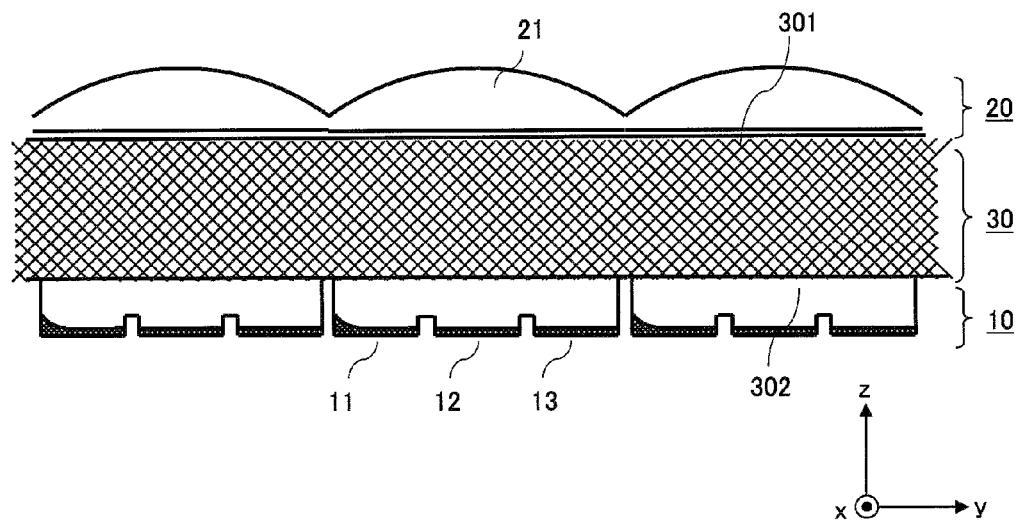
FIG. 9 is a configuration diagram illustrating a solid-state image pickup device according to a fourth embodiment.

FIG. 9 is a schematic configuration diagram illustrating a solid-state image pickup device according to a fourth embodiment. The following will mainly describe the difference between the present embodiment and the first embodiment.

In the first embodiment, the light receiving surface of each light receiving region is a flat surface. However, all or some of the light receiving surfaces of the light receiving regions 11 to 13 may be curved surfaces. In the example shown in FIG. 9, a portion of the light receiving surface of the green light receiving region 11, which portion corresponds to the outer circumference of the converging lens 21, is curved. Thus, by curving the light receiving surface of the light receiving region, the light receiving area can be increased.

In the case where at least a portion of the peripheral part of the light receiving surface is curved while the center part of the light receiving surface is substantially flat, the center part of the light receiving surface may be inclined with respect to the optical axis of the converging lens 21 as described in the fourth embodiment.

Embodiment 5

Figure 10:
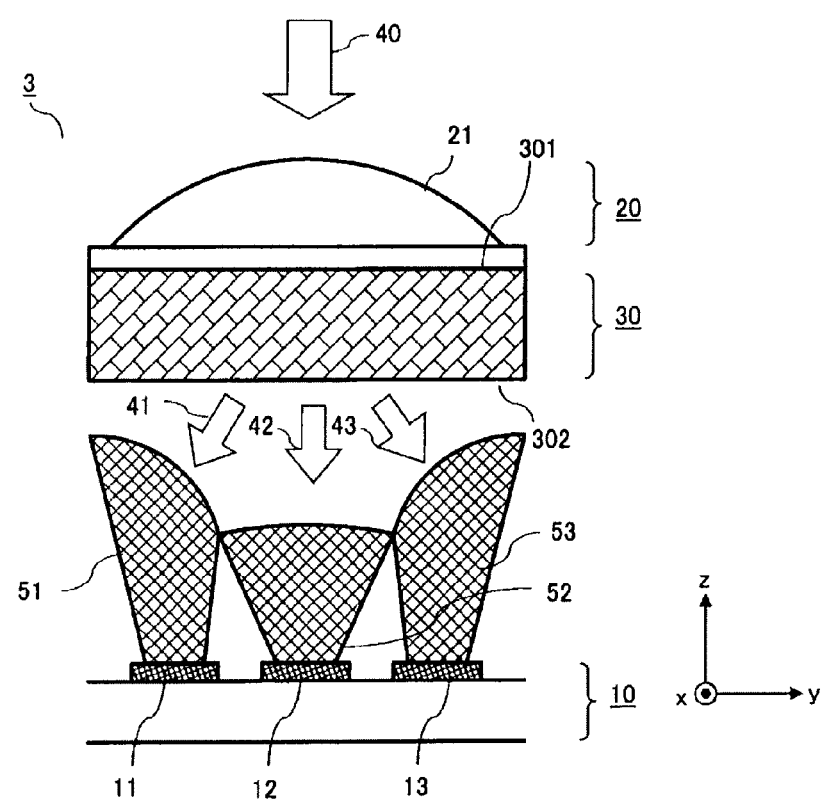
FIG. 10 is a configuration diagram illustrating a solid-state image pickup device according to a fifth embodiment.

FIG. 10 is a schematic configuration diagram illustrating a solid-state image pickup device according to a fifth embodiment. The following will mainly describe the difference between the present embodiment and the first embodiment.

The solid-state image pickup device 3 according to the present embodiment further includes, between the dispersing element 30 and the photoelectric conversion unit 10, three light guide members 51 to 53 for guiding the beams from the dispersing element 30 to the respective light receiving regions. The light guide member 51 receives the light of green wavelength band 41 diffracted by the dispersing element 30, and guides the received light to the green light receiving region 11. The light guide member 52 receives the light of red wavelength band 42 transmitted through the dispersing element 30, and guides the received light to the red light receiving region 12. The light guide member 53 receives the light of blue wavelength band 43 diffracted by the dispersing element 30, and guides the received light to the blue light receiving region 13.

The light guide members 51 to 53 are formed of a dielectric medium having a refractive index higher than that of the surrounding medium. For example, the light guide members 51 to 53 are formed of titanium oxide ($TiO_2$). Each of the light guide members 51 to 53 is formed so that its end face on the incident side is larger than its end face on the light receiving region side. Thus, by making the incident-side end face of each of the light guide members 51 to 53 larger than the emission-side end face thereof, the beams emitted from the dispersing element 30 can be guide to the light receiving regions more efficiently. Among the light guide members 51 to 53, the overall lengths of the light guide members 51 and 53 which guide the diffracted beams are greater than that of the light guide member 52 which guides the transmitted light, and the incident-side end faces of the light guide members 51 and 53 are inclined in accordance with the light diffraction angles. As a result, the diffracted beams can be converged more efficiently.

In the present embodiment, the incident-side end faces of the light guide members 51 to 53 are convexly curved. However, the end faces may be flat or concavely curved. Further, each of the light guide members 51 to 53 may have a refractive index gradient in which the refractive index gradually increases.

In the present embodiment, the light guide members 51 to 53 are formed of a dielectric medium having a refractive index higher than that of the surrounding medium. However, the present invention is not limited thereto. For example, the light guide members 51 to 53 may be realized by using a so-called photonic waveguide in which light is guided by utilizing disturbance of fine periodic structures made of a dielectric medium or air.

Figure 11:
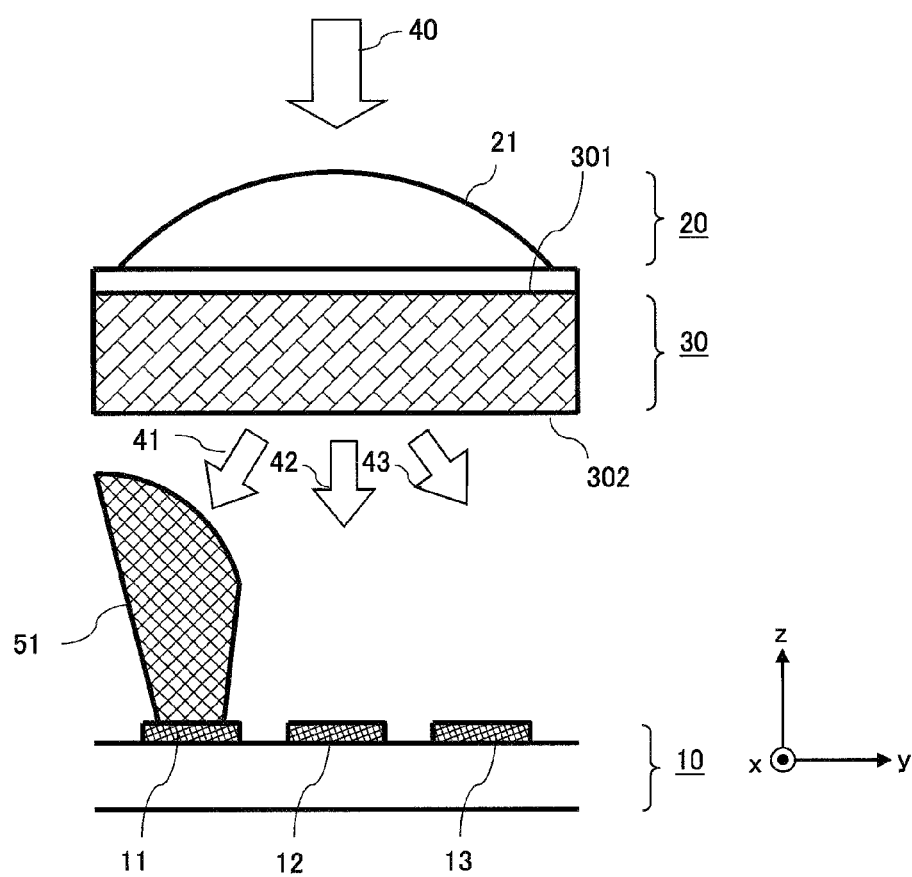
FIG. 11 is a configuration diagram illustrating another example of the solid-state image pickup device according to the fifth embodiment.

In the present embodiment, the light guide members 51 to 53 are provided corresponding to the light receiving regions 11 to 13, respectively. However, as shown in FIG. 11, a light guide member may be provided corresponding to one of the light receiving regions. In the example shown in FIG. 11, a light guide member 51 is provided corresponding to the green light receiving region 11, thereby improving the green light receiving efficiency.

Other Modifications

While the solid-state image pickup devices according to the embodiments of the present invention have been described, the present invention is not limited thereto. For example, in the above-described embodiments, three light receiving regions are provided corresponding to one converging lens. However, four or two light receiving regions may be provided corresponding to one converging lens. In this case, the design of diffraction and transmission for each frequency band can be changed in accordance with the number of the light receiving regions. Further, in the above-described embodiments, the dispersing element transmits the light of red wavelength band and diffracts the beams of blue and green wavelength bands. However, the present invention is not restricted thereto. For example, a dispersing element that transmits the light of green wavelength band and diffracts the beams of blue and red wavelength bands may be configured, and a dispersing element that transmits the light of blue wavelength band and diffracts the beams of green and red wavelength bands may be configured. Moreover, a dispersing element that disperses incident light into a visible light band and an infrared band may be configured to be applied to a solid-state image pickup device for taking an infrared image.

In order to further improve the incident light utilization efficiency, an anti-reflection structure may be provided on the light receiving surface of the light receiving region. More specifically, as the anti-reflection structure, fine concavities and convexities having a periodicity equal to or shorter than the wavelength of maximum intensity light that enters the light receiving surface, may be formed. Such an anti-reflection structure can significantly reduce reflection at the light receiving surface.

Embodiment 6

Figure 12:
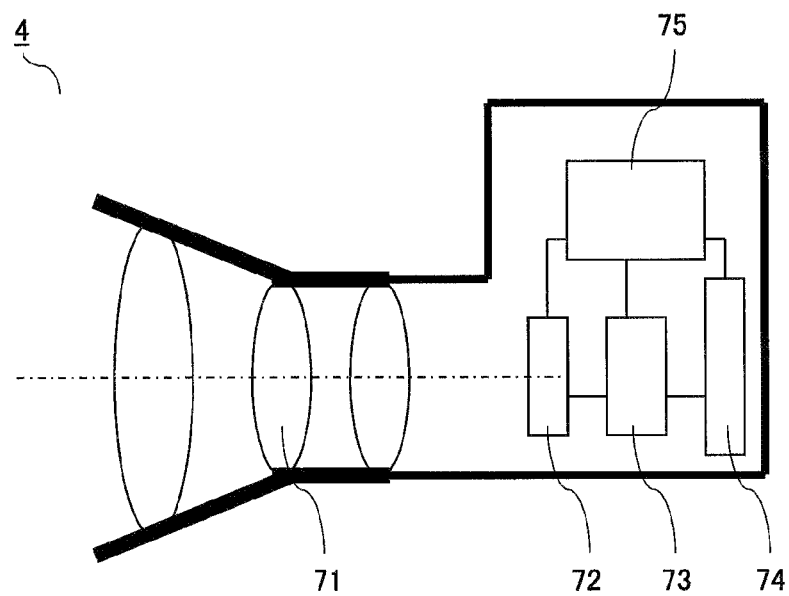
FIG. 12 is a schematic configuration diagram illustrating a camera device according to a sixth embodiment.
Figure 13:
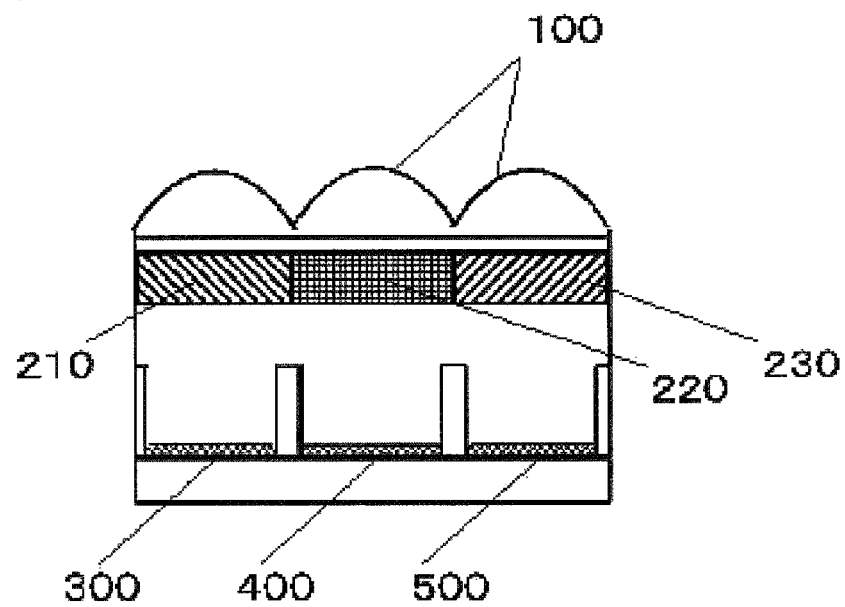
FIG. 13 is a schematic configuration diagram illustrating a part of a conventional solid-state image pickup device.

FIG. 12 is a schematic configuration diagram illustrating a camera device according to a sixth embodiment. The camera device 4 includes an imaging optical system 71, a solid-state image pickup device 72, an image processing circuit 73, an information recording medium 74, and a control circuit 75.

The imaging optical system 71 forms an optical image of an object on the solid-state image pickup device 72. The imaging optical system 71 is controlled by either or both of the control circuit 75 and a manual operation by a photographer, and thereby the zoom ratio, the focal point, and the like are changed.

The solid-state image pickup device 72 has a configuration of any of the above-described embodiments. The solid-state image pickup device 72 performs photoelectric conversion of light received by each light receiving region to generate an electric signal according to the intensity of the received light, and transfers the generated electric signal to the image processing circuit 73 under control of the control circuit 75. The image processing circuit 73 subjects the obtained electric signal to various kinds of image processes to generate image data of still image or video image, and records the generated image data in the information recording medium 74, based on an instruction from the control circuit 75.

Since the camera device 4 of the present embodiment uses the solid-state image pickup device of the present invention, it is possible to obtain light utilization efficiency higher than that of the conventional solid-state image pickup device using absorption type color filters. Therefore, sufficient sensitivity is obtained even during shooting in a dark place. That is, it is possible to obtain an output image even if the exposure time required for one shooting is reduced during shooting in a dark place, thereby reducing factors that cause image quality deterioration, such as hand blur and object blur. As a result, shooting of a high-quality image is realized.

The information recording medium 74 is not necessarily integrated with the camera, and the obtained image data may be transferred to and stored in an external recording medium that is separated from the camera body, via wireless or wired communication means, from the camera body.

In each of the above-described embodiments, the dispersing element of the present invention is applied to the solid-state image pickup device. However, the dispersing element of the present invention is applicable to devices other than the solid-state image pickup device. For example, the dispersing element of the present invention may be applied to a color filter of a liquid crystal display device. In this case, it is possible to configure a liquid crystal display device in which backlight utilization efficiency is improved.

The present invention is applicable not only to cameras for image taking, such as a digital still camera, a video camera, a monitor camera, and a compact camera mounted on a mobile device such as a mobile phone, but also to imaging devices for capturing image data, such as an information inputting device for robots. Further, the present invention is also suitable for display devices using color filters.

While the invention has been described in detail, the foregoing description is in all aspects illustrative and not restrictive. It will be understood that numerous other modifications and variations can be devised without departing from the scope of the invention.

What is claimed is:

1. A solid-state imaging device comprising:
    a photoelectric conversion unit having a plurality of light receiving regions that are two-dimensionally arrayed, the photoelectric conversion unit for photoelectrically converting light incident on each of the light receiving regions, and outputting an electric signal according to the intensity of the incident light;
    a lens unit comprising a plurality of converging lenses provided on an upper layer of the photoelectric conversion unit, each of the converging lenses being provided corresponding to a set of continuous first to third light receiving regions; and
    a dispersing element provided between the photoelectric conversion unit and the lens unit, the dispersing element having an incident surface and an emission surface and being formed of a medium whose refractive index varies periodically, and diffracting beams of a first wavelength band and of a third wavelength band, having been transmitted through the converging lens, and directing the beams onto the first light receiving region and the third light receiving region, and transmitting, without diffracting, a beam of a second wavelength band, having been transmitted through the converging lens, and directing the beam onto the second light receiving region, the dispersing element being a photonic crystal in which within a first medium having a first dielectric constant, a plurality of parallel columnar components, formed of a second medium having a second dielectric constant different from the first dielectric constant, are arranged periodically, and each of the columnar components is arranged so as to be parallel to the incident surface of the dispersing element and orthogonal to the direction along which the first to third light receiving regions are continuously arrayed, wherein in a cross section orthogonal to each of the columnar components, each of the columnar components is positioned on each of intersections of a grating having, as a unit cell, a parallelogram whose adjacent sides are unequal and whose interior angles are not right angles, and letting the sign of the angle that the beam of the first wavelength band emitted from the dispersing element forms with the emission surface of the dispersing element be positive, then the sign of the angle that the beam of the third wavelength band emitted from the dispersing element forms with the emission surface of the dispersing element is negative.

2. The solid-state image pickup device according to claim 1, wherein the refractive index of the dispersing element varies with the same periodicity over the entirety of the light receiving regions.

3. The solid-state image pickup device according to claim 1, wherein the dispersing element is configured in such a way that its refractive index distribution varies at a periodicity shorter than the wavelengths of the beams of the first and second wavelength bands.

4. The solid-state image pickup device according to claim 1, wherein the light receiving regions corresponding to a single converging lens receive beams of wavelength bands that each differ.

5. The solid-state image pickup device according to claim 4, wherein the angle that a beam transmitted through the dispersing element forms with respect to the light receiving surface of the first light receiving region is approximately 0°.

6. The solid-state image pickup device according to claim 1, wherein a light receiving surface of the first light receiving region is inclined with respect to the optical axis of the converging lens in such a way that the angle that a beam transmitted through the dispersing element forms with a line normal to the light receiving surface is smaller by comparison to the situation where the light receiving surface is not inclined.

7. The solid-state image pickup device according to claim 1, wherein on the light receiving surface of at least one of the light receiving regions a microscopically undulating structure having a periodicity equal to or shorter than the wavelength of maximum intensity beams incident on the light receiving surface is provided.

8. The solid-state image pickup device according to claim 1, wherein the light receiving surface of at least one of the light receiving regions is curved.

9. The solid-state image pickup device according to claim 1, wherein a midportion of the light receiving surface of the first light receiving region is inclined with respect to the optical axis of the converging lens in such a way that the angle that a beam transmitted through the dispersing element forms with respect to a line normal to the light receiving surface is smaller by comparison to the situation where the light receiving surface is not inclined, and a peripheral portion of the light receiving surface of the first light receiving region is curved.

10. The solid-state image pickup device according to claim 1 further including one or more light guide members provided between the dispersing element and the photoelectric conversion unit, for guiding light emitted from the dispersing element to the photoelectric conversion unit.

11. The solid-state image pickup device according to claim 10, wherein the one or more light guide members are provided corresponding to the first light receiving region, and guide a beam of the first wavelength band, having been diffracted by the dispersing element, onto the first light receiving region.

12. The solid-state image pickup device according to claim 10, wherein the one or more light guide members are provided corresponding to each of the first through third light receiving regions, and the respective light guide members guide the beams of the first to third wavelength bands, having been diffracted by the dispersing element, to the first through third light receiving regions, respectively.

13. The solid-state image pickup device according to claim 10, wherein the light guide member is formed of a medium having a refractive index higher than that of the surrounding medium.

14. The solid-state image pickup device according to claim 10, wherein the light guide member is a photonic crystal in which, within a medium having a predetermined dielectric constant, a medium having a dielectric constant different from the predetermined dielectric constant is periodically arranged at a periodicity equal to or shorter than the wavelength of incident light.

15. An imaging device comprising:
    an imaging optical system;
    a solid-state image pickup device according to claim 1, for converting an optical image formed by the imaging optical system into an electric signal; and
    an image processing circuit for performing image processing on the electric signal obtained by the solid-state image pickup device.

16. A dispersing element for deflecting at least part of light that enters from an incident surface, and emitting the light from an emission surface parallel to the incident surface, the dispersing element comprising:

a first medium having a first dielectric constant; and a second medium having a second dielectric constant different from the first dielectric constant; wherein the dispersing element diffracts beams of a first wavelength band and of a third wavelength band and transmits, without diffracting, a beam of a second wavelength band, the dispersing element being a photonic crystal in which within the first medium, a plurality of parallel columnar components; formed of the second medium are arranged periodically, and each of the columnar components is arranged so as to be parallel to the incident surface of the dispersing element, wherein in a cross section orthogonal to each of the columnar components, each of the columnar components is positioned on each of intersections of a grating having, as a unit cell, a parallelogram whose adjacent sides are unequal and whose angles are not right angles; and letting the sign of the angle that the beam of the first wavelength band emitted from the dispersing element forms with the emission surface of the dispersing element be positive, then the sign of the angle that the beam of the third wavelength band emitted from the dispersing element forms with the emission surface of the dispersing element is negative.

\* \* \* \* \*